United States Patent
deVilliers

(10) Patent No.: US 9,263,297 B2
(45) Date of Patent: Feb. 16, 2016

(54) METHOD FOR SELF-ALIGNED DOUBLE PATTERNING WITHOUT ATOMIC LAYER DEPOSITION

(71) Applicant: Tokyo Electron Limited, Minato-ku, Tokyo (JP)

(72) Inventor: Anton deVilliers, Clifton Park, NY (US)

(73) Assignee: Tokyo Electron Limited, Minato-ku, Tokyo (JP)

( * ) Notice: Subject to any disclaimer, the term of this patent is extended or adjusted under 35 U.S.C. 154(b) by 0 days.

(21) Appl. No.: 14/605,396

(22) Filed: Jan. 26, 2015

(65) Prior Publication Data

US 2015/0214070 A1 Jul. 30, 2015

Related U.S. Application Data

(60) Provisional application No. 61/932,487, filed on Jan. 28, 2014.

(51) Int. Cl.

| | | |
|---|---|---|
| *H01L 21/44* | (2006.01) | |
| *H01L 21/3213* | (2006.01) | |
| *H01L 21/321* | (2006.01) | |
| *H01L 21/308* | (2006.01) | |
| *H01L 21/02* | (2006.01) | |
| *H01L 21/033* | (2006.01) | |
| *H01L 21/314* | (2006.01) | |
| *H01L 21/311* | (2006.01) | |
| *H01L 27/108* | (2006.01) | |

(52) U.S. Cl.
CPC ...... *H01L 21/32133* (2013.01); *H01L 21/0228* (2013.01); *H01L 21/3086* (2013.01); *H01L 21/32115* (2013.01); *H01L 21/32139* (2013.01); *H01L 21/02164* (2013.01); *H01L 21/0337* (2013.01); *H01L 21/0338* (2013.01); *H01L 21/3141* (2013.01); *H01L 21/31144* (2013.01); *H01L 27/108* (2013.01); *H01L 2924/0002* (2013.01)

(58) Field of Classification Search
CPC ........... H01L 21/32133; H01L 21/32115; H01L 21/0228; H01L 21/3086; H01L 21/32139; H01L 21/02164; H01L 27/108; H01L 21/0337; H01L 21/0338; H01L 21/31144; H01L 21/3141; H01L 23/481; H01L 2924/0002
USPC ......... 438/669, 671, 672, 691, 692, 702, 703, 438/361; 257/390, 774, 471, E21.476, 257/E21.577

See application file for complete search history.

(56) References Cited

U.S. PATENT DOCUMENTS

| | | | |
|---|---|---|---|
| 4,921,778 A | 5/1990 | Thackeray et al. | |
| 5,259,926 A | 11/1993 | Kuwabara et al. | |

(Continued)

OTHER PUBLICATIONS

International Application No. PCT/US2015/012896, International Search Report and Written Opinion, mailed Apr. 29, 2015, International Filing Date Jan. 26, 2015.

*Primary Examiner* — Thinh T Nguyen
(74) *Attorney, Agent, or Firm* — DLA Piper LLP (US)

(57) ABSTRACT

A method for self-aligned double patterning without needing atomic layer deposition techniques is disclosed. Techniques include using a staircase etch technique to preferentially shrink one material without shrinking an underlying material, followed by a resist-based chemical polishing and planarization technique that yields a narrowed and protruding feature (single-layer thickness) that is sufficiently physically supported, and that can be transferred to one or more underlying layers. After removing a resist coating, the result is a pattern that has been doubled without using ALD techniques. Such techniques improve efficiencies over conventional techniques for self-aligned double patterning.

15 Claims, 3 Drawing Sheets

(56) References Cited

U.S. PATENT DOCUMENTS 5,527,662 A 6/1996 Hashimoto et al.
5,614,336 A 3/1997 Mikami et al.
2012/0018891 A1* 1/2012 Lin .................. H01L 21/76802
 257/773
2012/0045721 A1 2/2012 Printz et al.

* cited by examiner

METHOD FOR SELF-ALIGNED DOUBLE PATTERNING WITHOUT ATOMIC LAYER DEPOSITION

CROSS REFERENCE TO RELATED APPLICATIONS

The present application claims the benefit of U.S. Provisional Patent Application No. 61/932,487, filed on Jan. 28, 2014, entitled "Method for Self-Aligned Double Patterning without Atomic Layer Deposition," which is incorporated herein by reference in its entirety.

BACKGROUND OF THE INVENTION

This disclosure relates to substrate processing, and, more particularly, to techniques for patterning substrates including patterning of semiconductor wafers.

Methods of shrinking line-widths in lithographic processes have historically involved using greater-NA (numerical aperture) optics, shorter exposure wavelengths, or interfacial media other than air (e.g., water immersion). As the resolution of traditional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material (such as photoresist) to a surface of a substrate. This radiation-sensitive material is transformed into a relief pattern (patterned mask) that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent. This patterned mask may comprise multiple sub-layers.

SUMMARY

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques. One approach to reduce the feature size is to use a conventional lithographic pattern and etch techniques on the same substrate twice (known as LELE—Litho/Etch/Litho/Etch), thereby forming larger patterns spaced closely together to achieve a smaller feature size than would be possible by a single exposure lithographic exposure. During LELE double patterning, the substrate is exposed to a first pattern and the first pattern is developed in the radiation-sensitive material. This first pattern is formed in the radiation-sensitive material and is transferred to an underlying layer using an etching process. This series of steps is repeated to create a second pattern.

Another approach to reduce feature size is to use a conventional lithographic pattern on the same substrate twice followed by etch techniques (known as LLE—Litho/Litho/Etch), thereby forming larger patterns spaced closely together to achieve a smaller feature size than would be possible by single exposure. During LLE double patterning, the substrate is exposed to a first pattern and then the substrate is exposed to a second pattern. The first pattern and the second pattern are developed in the radiation-sensitive material. The resulting first pattern and the second pattern formed in the radiation-sensitive material can then be transferred to an underlying layer using an etching process, such as a plasma-based dry etching/reactive ion etching.

Another approach to LLE double patterning includes a Litho/Freeze/Litho/Etch (LFLE) technique that uses an application of a freeze material on a first patterned layer to cause cross-linking therein, thereby allowing the first patterned layer to withstand subsequent processing of patterning a second layer with a second pattern. Instead of applying the freeze material, a second LFLE freeze technique involves including a cross-linker additive material within the first layer (prior to exposure). This cross-linker is then thermally activated to increase resistivity to solvents. Thus this "freeze" refers to changing material properties of a patterned layer to be able to withstand other solvents or resists coated on top. Conventional LFLE techniques, however, suffer from poor throughput and unacceptable defectivity, among other things.

Finally, another technique for double patterning is known as sidewall image transfer. With sidewall image transfer, a given substrate typically begins with a pattern of protruding lines or features. These features are then conformally coated with a thin film using atomic layer deposition (ALD). After atomic layer deposition, an etch process can be used to remove the ALD film from tops of protruding features and from in between protruding features. A thin film remains on sidewalls of the features (sidewall of mandrels). The protruding features can be removed thereby leaving the ALD film—formerly a sidewall film—as a new features or mandrels with the pattern essentially being doubled.

Although sidewall image transfer techniques using atomic layer deposition for double patterning can be effective, there are also drawbacks to using atomic layer deposition. One drawback can include lowered efficiency. For example, atomic layer deposition can involve using multiple different semiconductor fabrication tools. One tool can be used for photolithographic coating/developing, another tool can be used for applying a thin film via atomic layer deposition, and another separate tool can be used for etching processes. Moving a substrate back and forth between semiconductor fabrication tools can increase processing time thereby lowering efficiency.

Techniques disclosed herein, however, provide a method for self-aligned double patterning without needing to resort to atomic layer deposition techniques. Accordingly, techniques herein can provide improved efficiencies over conventional techniques for self-aligned double patterning. Techniques disclosed herein include using a staircase etch technique followed by a resist-based chemical polishing and planarization technique to yield a narrowed and protruding feature (single-layer thickness) that has relatively strong physical support, and that can be effectively transferred to one or more underlying layers. After removing a resist coating the result is a pattern that has been doubled without using ALD techniques.

One embodiment includes a method for patterning a substrate. This method includes receiving a substrate having a patterned layer positioned on an underlying layer. The patterned layer comprises at least two layers of differing composition including a first component layer positioned on a second component layer. A substantially isotropic etch operation is executed using chemistry that selectively etches the first component layer as compared to the second component layer. The result is that the first component layer is at least horizontally slimmed relative to the second component layer. A planarizing film is deposited on the substrate such that the planarizing film yields a first planar surface on an upper portion of the substrate. The planarizing film includes a solubility-changeable material. A solubility-changing agent is deposited on the first planar surface of the planarizing film. The solubility-changing agent is activated such that the solubility-changing agent changes a solubility of a top portion of the planarizing film. This top portion of the planarizing film has a thickness extending vertically from the first planar surface of the planarizing film to a predetermined depth within the planarizing film. The top portion of the planarizing film is removed resulting in a top surface of the first component layer being uncovered. An anisotropic etching operation is executed that etches through the first component layer and that etches through uncovered portions of the second component layer using the planarizing film as an etch mask. The planarizing film remaining can be removed such that a second pattern defined by the second component layer is uncovered.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques disclosed herein include using a staircase etch technique followed by a resist-based chemical polishing and planarization technique to yield a narrowed and protruding feature which can be single-layer thickness and be better supported as compared to sidewall spacers and other double patterning techniques. Features created herein can be transferred to one or more underlying layers and/or doubled again. After removing a resist coating the result is a pattern that has been doubled without using atomic layer deposition (ALD) techniques. Methods herein use a combination of coating/developing techniques and etching techniques. Advantages of techniques herein include making relatively small features having relatively large spaces between the small features. This can include creating patterns having a 1:3 ratio (that is, the size of a feature as compared to a space next to the feature). Conventionally, getting to a 1:3 ratio pattern has been desirable, but challenging. Methods herein, however, can arrive at a 1:3 patterning ratio while only having single height features unsupported at any given point in the patterning process.

FIGS. 1-10 illustrate an example process flow as described herein. Note the multiple different materials can be used for the various layers in a film stack as long as effective etch selectivities are used. Thus, first, second and third materials can be used—which can be varied—but for convenience in describing an example process flow embodiment specific types of materials may be referenced. Note, however, that such naming of materials is for illustration purposes only.

Figure 1:
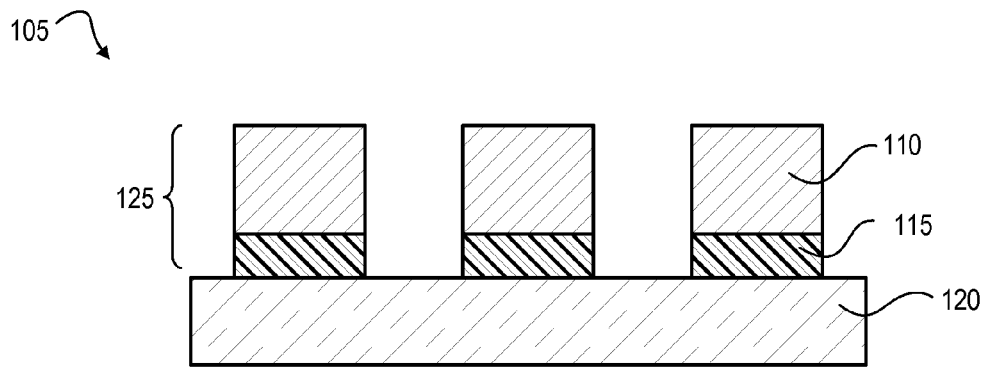
FIG. 1 is a cross-sectional schematic view of an example substrate segment showing a process flow according to embodiments disclosed herein.

One embodiment includes a method for patterning a substrate. Referring now to FIG. 1, an example segment of substrate 105 is depicted. Substrate 105 is received having a patterned layer 125 positioned on an underlying layer 120. The patterned layer 125 comprising at least two layers of differing composition including a first component layer 110 positioned on a second component layer 115. In other words, substrate 105 can include a narrow trench pre-pattern stack with an initial relief pattern. First component layer 110 can be an oxide layer, and second component layer can be a nitride layer. Together the oxide layer and nitride layer can define trenches or holes, for example. The first component layer and the second component layer initially define coplanar sidewalls. Underlying layer 120 can be selected as, for example, amorphous carbon or silicon or any other material that can provide or enable a differing etch selectivity after executing an ALD-free double patterning sequence herein. Typically, first component layer 110 is selected to have an etch selectivity relative to second component layer 115, or vice versa. Having a good etch selectivity between these two materials is beneficial for a subsequent staircase etch step.

Patterned layer 125 can be the result of any number of previous patterning operations. For example, patterned layer 125 can be a result of lithographic patterning of photoresist as a mask layer for pattern creation and/or pattern transfer, or can be the result of a previous pitch doubling operation. Regardless of the type of materials used, or method of initially patterning the substrate, the substrate stack includes a bilayer pattern defining features in which each layer of the bilayer can be selectively etched relative to the other layer. Note also that in FIG. 1, it can be beneficial to have the oxide layer of greater height than the nitride layer. This height ratio is not limiting but can be useful for subsequent processing. Because the nitride layer may be used as a mask in subsequent steps, having the nitride layer as thin as possible can be beneficial. Having the oxide layer (first component layer 110) relatively taller can be beneficial with a subsequent conformal shrink. In some embodiments the oxide layer can be twice the height of the nitride layer or ten times the height nitride layer, etc. A height of the oxide layer can be selected to be sufficient to accommodate a top-down acid diffusion planarization step, which will be described below.

Figure 2:
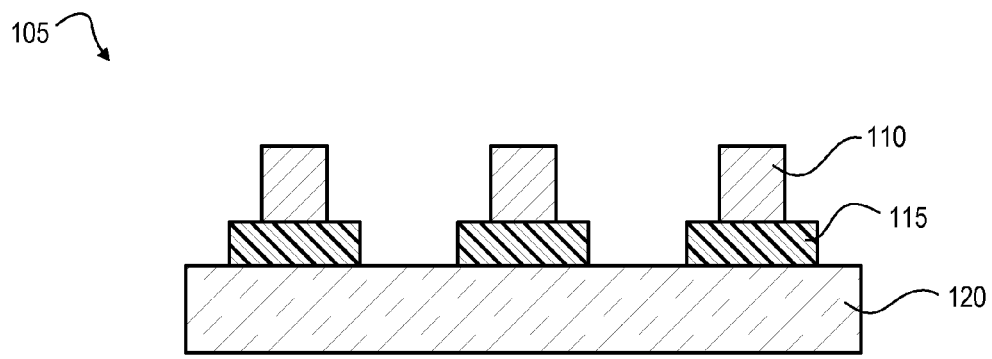
FIG. 2 is a cross-sectional schematic view of an example substrate segment showing a process flow according to embodiments disclosed herein.

After providing/receiving a substrate having a pattern as described above, a slimming etch operation—known as a staircase etch—is executed that horizontally slims features in the top layer of the bilayer film. Thus, an isotropic etch operation (substantially, partially, or entirely isotropic) is executed that uses chemistry that selectively etches the first component layer as compared to the second component layer (without substantially etching the second component layer) such that the first component layer is at least horizontally slimmed relative to the second component layer. Note that there may be vertical slimming as well. This etch step can be executed, for example, by using a fully or partially isotropic etch that is selective to the oxide layer in that the oxide layer is etched while an etch chemistry being used does not etch the nitride layer or does not substantially etch the nitride layer. Techniques herein can function with oxide being etched at two to three times a rate at which nitride is being etched, but preferably the etch rate of one material to another is five times or ten times greater or more. It can be beneficial in many operations to have a partially anisotropic etch to prevent forming a rounded interface (rounded footing) at the nitride surface. This step can be described as a staircase etch or stepped etch because the intended result is to provide a geometric step or square feature. An example result is shown in FIG. 2.

Figure 3:
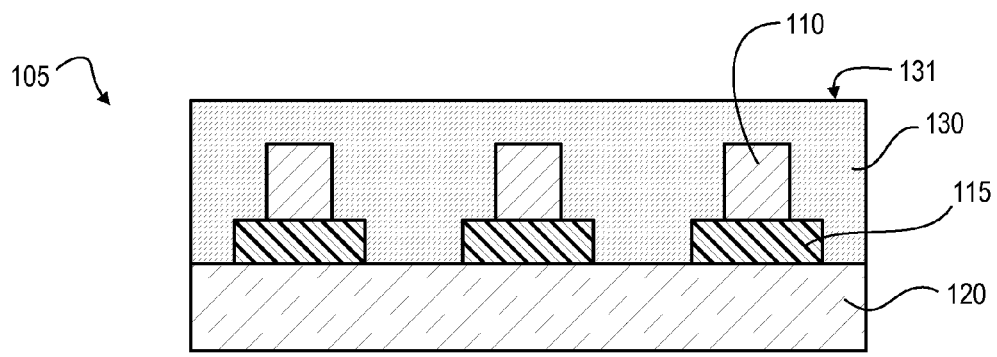
FIG. 3 is a cross-sectional schematic view of an example substrate segment showing a process flow according to embodiments disclosed herein.

A planarizing film 130 is then deposited on the substrate 105 such that the planarizing film 130 yields a first planar surface 131 on an upper portion of the substrate 105. The planarizing film 130 includes a solubility-changeable material. This solubility-changeable material can include a photoresist or similar material. Thus, after an oxide slimming step, that is, a staircase etch step, a resist overcoat can applied to substrate 105. The resist coat can be sufficiently thick or high to completely cover both the nitride and oxide features. Any of various types of resists can be used. An example result is shown in FIG. 3.

Figure 4:
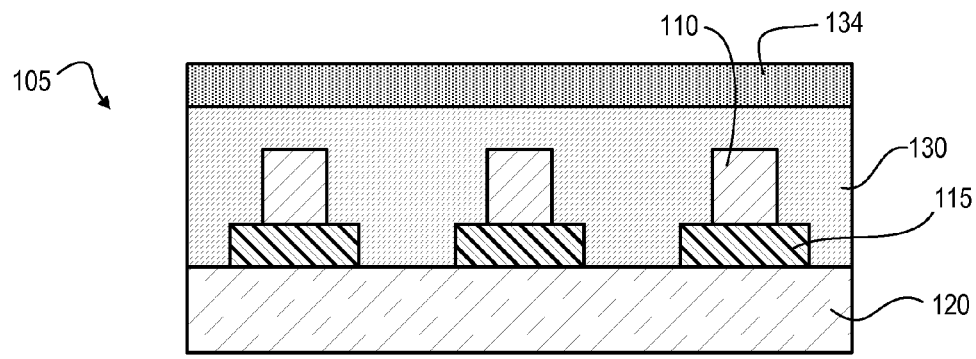
FIG. 4 is a cross-sectional schematic view of an example substrate segment showing a process flow according to embodiments disclosed herein.
Figure 5:
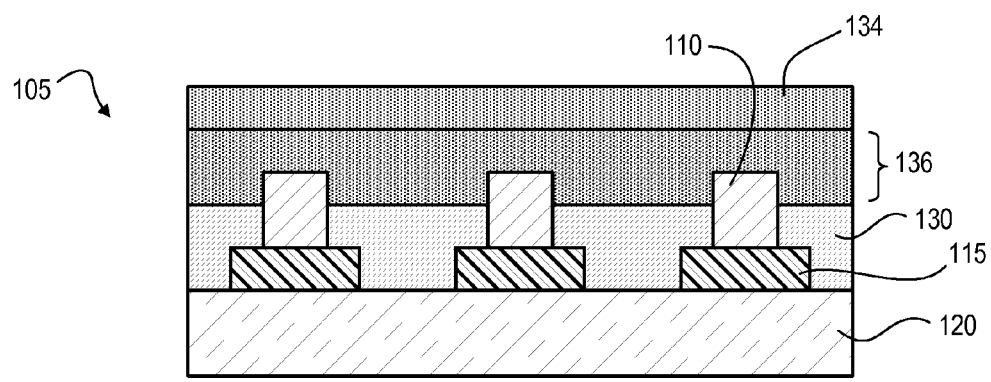
FIG. 5 is a cross-sectional schematic view of an example substrate segment showing a process flow according to embodiments disclosed herein.

With the planarizing film 130 on substrate 105, a solubility-changing agent 134 is deposited on the first planar surface 131 of the planarizing film 130. The solubility-changing agent 134 is activated such that the solubility-changing agent 134 changes a solubility of a top portion 136 of the planarizing film 130. The top portion 136 of the planarizing film 130 has a thickness extending vertically from the first planar surface 131 of the planarizing film 130 to a predetermined depth within the planarizing film 130. FIGS. 4 and 5 illustrate this chemical planarization process for a resist overcoat. Activating the solubility-changing agent 134 causes this agent to diffuse vertically through the resist overcoat.

Activation of the solubility changing agent can be accomplished via various techniques such as by application of heat (baking the substrate), UV flood exposure, etc. Baking, for example, can cause the solubility-changing agent 134 (such as an acid or photoacid generator) to diffuse vertically downward towards the underlying layers. A distance of diffusion can be precisely controlled using various parameters such as type of resist, type of solubility-changing agent used, activation temperature, baking time, and so forth. With the solubility-changing agent diffused a predetermined vertical distance into the resist overcoat, a solubility of the resist throughout the diffusion length (top portion 136) is changed or can be subsequently changed by application of light. FIG. 5 depicts the solubility-changing agent 134 having diffused through the resist overcoat to a distance that is at least a height of a top surface of the oxide layer or slightly below a top surface of the oxide layer. Diffusing the solubility-changing agent 134 at least to a distance for uncovering the first component layer enables subsequent etching of the first component layer. In other embodiments, it can be beneficial to have the solubility-changing agent diffuse substantially below a top surface of the first component layer.

Figure 6:
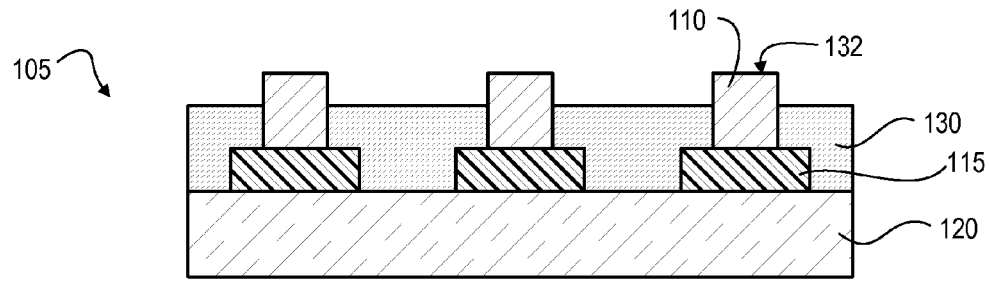
FIG. 6 is a cross-sectional schematic view of an example substrate segment showing a process flow according to embodiments disclosed herein.

With top portion 136 of the planarization film 130 now soluble, this top portion is then developed (removed) which results in a top surface 132 of the first component layer being uncovered. This can leave features from the first component layer essentially protruding through a planarized resist overcoat as shown in FIG. 6. The height about which the first component layer protrudes above the planarizing film can be selected based on fabrication or patterning objectives, such as twice as high, three times as high, or more. Note, however, that one advantage of such a patterning technique is that oxide layer features are structurally supported by a resist layer with only a small portion projecting above—or even with—a top of the planarizing film. Mechanical type planarization techniques cannot provide such a result and would lose height in the oxide layer.

Figure 7:
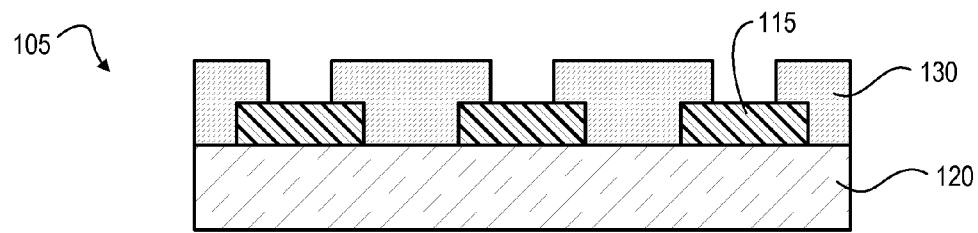
FIG. 7 is a cross-sectional schematic view of an example substrate segment showing a process flow according to embodiments disclosed herein.
Figure 8:
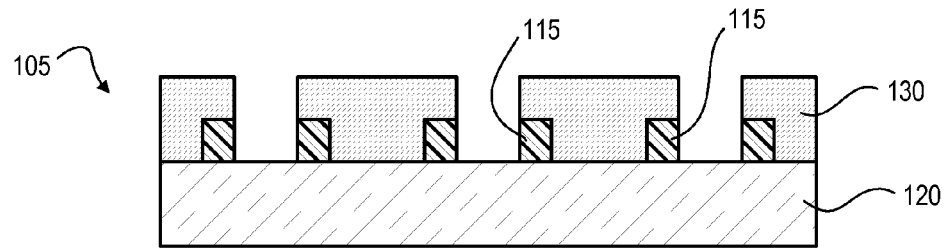
FIG. 8 is a cross-sectional schematic view of an example substrate segment showing a process flow according to embodiments disclosed herein.

With the oxide layer exposed, an exhume etch operation can be executed. Embodiments include executing an anisotropic etching operation that etches through the first component layer and that etches through uncovered portions of the second component layer using the planarizing film 130 as an etch mask. In one embodiment, separate chemistries can be used to etch the first component layer as compared to the second component layer. In other embodiments a particular chemistry can be selected that will simultaneously etch both the oxide layer and the nitride layer. FIG. 7 shows results of the first component layer being removed via an etching operation or otherwise. Note now that with first component layer removed, portions of the second component layer have been uncovered with remaining portions of the second component layer being covered by the planarizing film 130. The first component layer can be removed via isotropic or anisotropic etching with sufficient etch selectivity between materials. Etching of the second component layer 115 (nitride layer) will typically benefit from using an anisotropic etch so that portions of the planarizing film function as an etch mask. FIG. 8 shows an example result after etching (exhume etch) of the second component layer 115.

Figure 9:
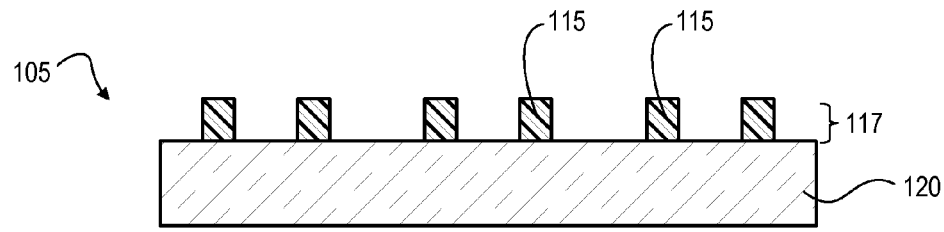
FIG. 9 is a cross-sectional schematic view of an example substrate segment showing a process flow according to embodiments disclosed herein.
Figure 10:
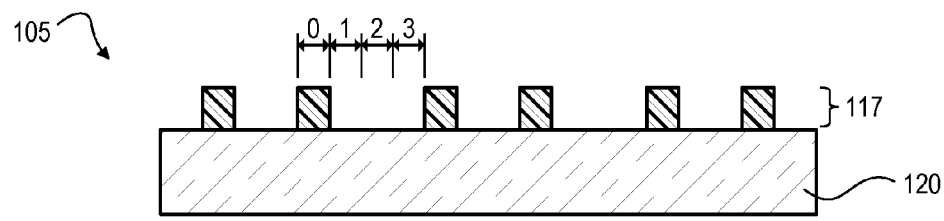
FIG. 10 is a cross-sectional schematic view of an example substrate segment showing a process flow according to embodiments disclosed herein.

After both the oxide and nitride layers have been etched down to the amorphous carbon layer, remaining portions of the planarizing film can be removed such that a second pattern defined by the second component layer is uncovered. Removal of the planarizing film can be accomplished via a wet or dry etch operation, or by an ashing operation. FIG. 9 shows example results of how the initial pattern has been doubled, or that a pitch of the initial pattern has been doubled without using atomic layer deposition or sidewall image transfer. FIG. 10 also shows that such techniques can be used to create a 1:3 patterning ratio, which ratio can be beneficial for any subsequent ALD steps and/or other patterning techniques.

The resulting pattern can then be used with any number of subsequent processing and patterning techniques. For example, after creating a patterned substrate having a 1:3 ratio, a single ALD step can be executed to double the pattern. This means that the initial pattern can be quadrupled by adding an ALD step.

Another embodiment includes a method for patterning a substrate. This method includes receiving a substrate having a patterned layer positioned on an underlying layer. The patterned layer comprising at least two layers of differing composition including a first component layer positioned on a second component layer. An isotropic etch operation is executed using chemistry that selectively etches the first component layer as compared to the second component layer such that the first component layer is horizontally slimmed relative to the second component layer. A planarizing film is deposited on the substrate such that the planarizing film yields a first planar surface on the upper portion of the substrate. The planarizing film including a solubility-changeable material. An acid-based planarization is executed that includes diffusing acid to a predetermined distance through a solubility-changing material and removing a top portion of the planarizing film resulting a top surface of the first component layer being uncovered. An anisotropic etching operation is executed that etches through the first component layer and that etches through the second component layer using the planarizing film as an etch mask. The planarizing film is then removed such that a second patterned layer defined by the second component layer is uncovered.

Regarding the chemical planarization step above, this technique can include using a developable planarization material, and slimming a height of this planarization material to a target value. For example, developer soluble bottom anti-reflective coating (DBARC) is a BARC that simultaneously develops with a photoresist. Using silicon (Si) DBARC—or other developer fill material—constructed features on a substrate can be planarized without using chemical-mechanical polishing (CMP). In one specific example, an entire substrate is coated with a relatively large amount of Si-DBARC (silicon-based developable anti-reflective coating), which provides a planar film over non-planar structures. The Si-DBARC is then coated with acid to remove an amount of Si-DBARC in a vertical direction down to a set stopping point, thereby planarizing the substrate. After the substrate is planarized, semiconductor manufacturing processing can continue and skip CMP steps, thereby saving time and money. This technique disclosed herein can be referred to as a Chemical Polishing and Planarization (CPP) process. This CPP process enables structures to be built on multiple layers at one time with a substrate remaining in a coater/developer tool. This removes a plasma etch step (eliminates two transport steps), saves the substrate, and provides more flexibility in choosing a resist.

In more detail, using a developable planarization material, a height of the planarization material can be slimmed to a target value. Chemical polishing and planarization (CPP) processes can be used when a substrate (such as a silicon wafer) has topographical features such as lines, plateaus, trenches, or any structures. A thin film of a planarizing, developable material (such as Si-DBARC) is applied to the substrate by spin coating, spray coating, or dip coating techniques so that the film covers all structures completely. Next a thin coat of a solubility-changing agent (such as a temperature acid generator (TAG) or other compatible acid) is applied via spin coating, spray coating, vapor exposure, or dip coating techniques. The solubility-changing agent then dissolves (or shifts solubility of) a top layer of the planarizing film (Si-DBARC) without dissolving the entire planarizing film. This top layer, for example can have a thickness extending between a top surface of the planarizing film and a top of a highest structure on the substrate or to a point above the highest structure. If a TAG is used, then the amount of acid released can be finely controlled by the temperature and duration of baking. Baking a TAG will release a specified amount of acid to reach a specified or target depth. This top layer can then be dissolved and washed away. Subsequently baking the Si-DBARC at a hotter temp will harden the Si-DBARC and make it undevelopable. This creates a smooth, even plane on top of the substrate. Thus, the CMP step can be completely replaced with developer-based planarization. Developer-based planarization also enables structures to be added via lithography and etching at multiple heights on the substrate. New structures can be created in one pass on top of any existing structures regardless of current height differentials, reducing the number of required passes to complete the microchip process.

Techniques herein include wet slimming planarization techniques, which can be implemented using diffusion-limited developer steps. Instead of using spin-on glass followed by CMP, techniques herein use a developable fill-coat material. Developable materials are materials that interact with photoacids, acids, and bases and change their solubility. In the past developable materials, when deposited, formed generally conformal films (that is, films that assumed a topography of a structure). Recently, materials that happen to be non-conformal (films that can create a planar layer) have been made developable. By making such materials developable, resulting films can interact with developer solutions and/or have some differential solubility (ability to have a solubility changed). Solubility-changing agents (such as an acid or photoacid) can diffuse into a developable material with accurate control, such as diffusing to a specified number of nanometers. Note that photoacid used herein does not need exposure. For example a photo acid can be synthesized that has already been exposed, so there is no exposure needed. Instead, the solubility-changing agent process can be a temperature-based or time-based process. Accordingly, techniques herein can use a temperature acid generator process instead of scanner process. Photoacid can be introduced as a material on a developable planar layer. This photoacid material is then baked down from the top to a known diffusion length, such as to the top of a tallest structure covered by the developable planarizing film. The photoacid can be baked down a known length to stop on queue. The amount of acid used, time of baking and temperature of baking is dependent on type of planarizing film and target diffusion depth. Conventional data for wet slimming of lateral critical dimensions can be translated and extrapolated to identify sufficient baking temperatures, bake times, and solubility-changing agents.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
    receiving a substrate having a patterned layer positioned on an underlying layer, the patterned layer comprising at least two layers of differing composition including an first component layer positioned on a second component layer;
    executing an isotropic etch operation using chemistry that selectively etches the first component layer as compared to the second component layer such that the first component layer is at least horizontally slimmed relative to the second component layer;
    depositing a planarizing film on the substrate such that the planarizing film yields a first planar surface on an upper portion of the substrate, the planarizing film including a solubility-changeable material;
    depositing a solubility-changing agent on the first planar surface of the planarizing film and activating the solubility-changing agent such that the solubility-changing agent changes a solubility of a top portion of the planarizing film, the top portion of the planarizing film having a thickness extending vertically from the first planar surface of the planarizing film to a predetermined depth within the planarizing film;
    removing the top portion of the planarizing film resulting in a top surface of the first component layer being uncovered;
    executing an anisotropic etching operation that etches through the first component layer and that etches through uncovered portions of the second component layer using the planarizing film as an etch mask; and
    removing the planarizing film such that a second pattern defined by the second component layer is uncovered.

2. The method of claim 1, wherein the predetermined depth is approximately at a top surface of the first component layer.

3. The method of claim 1, wherein the predetermined depth is below a top surface of the first component layer.

4. The method of claim 1, wherein the first component layer and the second component layer initially define coplanar sidewalls.

5. The method of claim 1, wherein a height ratio of the first component layer to the second component layer is greater than 3 to 1.

6. The method of claim 1, wherein executing the isotropic etch operation includes an entirely isotropic etch operation.

7. The method of claim 1, wherein selectively etching the first component layer as compared to the second component layer includes the first component layer being etch at a rate that is at least five times greater than an etch rate of the second component layer.

8. The method of claim 1, wherein the patterned layer is an initial relief pattern.

9. The method of claim 8, wherein the initial relief pattern defines one or more trenches.

10. The method of claim 8, wherein the initial relief pattern defines one or more holes.

11. The method of claim 1, further comprising:
    depositing a conformal film on the second pattern defined by the second component layer via atomic layer deposition; and
    executing a spacer etch process that creates sidewall spacers from material deposited via atomic layer deposition.

12. A method for patterning a substrate, the method comprising:
    receiving a substrate having a patterned layer positioned on an underlying layer, the patterned layer comprising at least two layers of differing composition including a first component layer positioned on a second component layer;
    executing an isotropic etch operation using chemistry that selectively etches the first component layer as compared to the second component layer such that the first component layer is horizontally slimmed relative to the second component layer;
    depositing a planarizing film on the substrate such that the planarizing film yields a first planar surface on an upper portion of the substrate, the planarizing film including a solubility-changeable material;
    executing an acid-based planarization that includes diffusing acid to a predetermined distance through a solubility-changing material and removing a top portion of the planarizing film resulting a top surface of the first component layer being uncovered;
    executing an anisotropic etching operation that etches through the first component layer and that etches through the second component layer using the planarizing film as an etch mask; and
    removing the planarizing film such that a second patterned layer defined by the second component layer is uncovered.

13. The method of claim 12, wherein the second patterned layer defined by the second component layer has a 1:3 spacing ratio of features.

14. The method of claim 13, further comprising:
depositing a conformal film on the second patterned layer defined by the second component layer via atomic layer deposition; and
executing a spacer etch process that creates sidewall spacers from material deposited via atomic layer deposition.

15. The method of claim 14, wherein the planarizing film is a silicon-based developable anti-reflective coating.

* * * * *